United States Patent
Yamauchi et al.

(10) Patent No.: US 10,543,661 B2
(45) Date of Patent: Jan. 28, 2020

(54) METAL FOIL WITH RESIN, AND METAL-CLAD LAMINATE AND CIRCUIT BOARD USING SAME

(71) Applicant: Panasonic Intellectual Property Management Co., Ltd., Osaka (JP)

(72) Inventors: Akihiro Yamauchi, Osaka (JP); Yoshiaki Esaki, Osaka (JP); Takayoshi Ozeki, Osaka (JP); Hiroaki Umehara, Osaka (JP); Hiroharu Inoue, Osaka (JP); Yoshihiko Nakamura, Fukushima (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 67 days.

(21) Appl. No.: 15/753,571

(22) PCT Filed: Sep. 2, 2016

(86) PCT No.: PCT/JP2016/004017
§ 371 (c)(1),
(2) Date: Feb. 20, 2018

(87) PCT Pub. No.: WO2017/043062
PCT Pub. Date: Mar. 16, 2017

(65) Prior Publication Data
US 2018/0250916 A1 Sep. 6, 2018

(30) Foreign Application Priority Data

Sep. 11, 2015 (JP) .................. 2015-179619

(51) Int. Cl.
| | |
|---|---|
| B32B 15/08 | (2006.01) |
| B32B 15/092 | (2006.01) |
| C08G 59/62 | (2006.01) |
| H05K 1/03 | (2006.01) |
| C08G 65/44 | (2006.01) |
| C08K 3/36 | (2006.01) |
| C08L 63/00 | (2006.01) |

(52) U.S. Cl.
CPC ............ *B32B 15/092* (2013.01); *C08G 59/62* (2013.01); *C08G 65/44* (2013.01); *C08K 3/36* (2013.01); *C08L 63/00* (2013.01); *H05K 1/03* (2013.01)

(58) Field of Classification Search
USPC ........................................ 428/418
See application file for complete search history.

(56) References Cited

U.S. PATENT DOCUMENTS

| | | | | |
|---|---|---|---|---|
| 4,122,073 A | * | 10/1978 | Georgoudis | ........... C08G 63/08 525/127 |
| 2007/0135609 A1 | | 6/2007 | Carrillo et al. | |
| 2009/0247724 A1 | | 10/2009 | Carrillo et al. | |
| 2015/0259489 A1 | | 9/2015 | Umehara et al. | |

FOREIGN PATENT DOCUMENTS

| | | |
|---|---|---|
| CN | 104908389 A | 9/2015 |
| JP | 10-298407 | 11/1998 |
| JP | 2004-269785 | 9/2004 |
| JP | 2006-137942 | 6/2006 |
| JP | 2007-138152 | 6/2007 |
| JP | 2008-007756 | 1/2008 |
| JP | 2008-133329 | 6/2008 |
| WO | 2007/067669 | 6/2007 |

OTHER PUBLICATIONS

International Search Report of PCT application No. PCT/JP2016/004017 dated Oct. 11, 2016.
English Translation of Chinese Search Report dated Jul. 2, 2019 for related Chinese Patent Application No. 201680051934.5.

* cited by examiner

*Primary Examiner* — Terressa Boykin
(74) *Attorney, Agent, or Firm* — Greenblum & Bernstein, P.L.C.

(57) ABSTRACT

A metal foil with resin is a metal foil with resin including a metal foil and a resin layer disposed on the metal foil, resin layer being obtained by half-curing a resin composition. The resin composition contains a first component that is a polymer, a second component that is a polyarylene ether copolymer, and a third component that is an epoxy resin. The first component has structures represented by formulae (1) and (2) below, with no unsaturated bond between carbon atoms. The third component has two or more epoxy groups per molecule. The second component is compatible with the first component, and the third component is incompatible with the first component.
In the formulae (1) and (2), a ratio between x and y is x:y=0:1 to 0.35:0.65, R1 represents hydrogen atom or methyl group, and R2 represents hydrogen atom or an alkyl group.

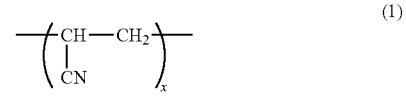

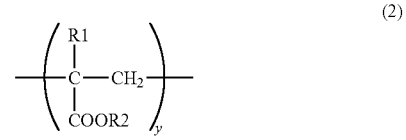

10 Claims, 2 Drawing Sheets

METAL FOIL WITH RESIN, AND METAL-CLAD LAMINATE AND CIRCUIT BOARD USING SAME

This application is a U.S. national stage application of the PCT International Application No. PCT/JP2016/004017 filed on Sep. 2, 2016, which claims the benefit of foreign priority of Japanese patent application 2015-179619 filed on Sep. 11, 2015, the contents all of which are incorporated herein by reference.

TECHNICAL FIELD

The present disclosure relates to a metal foil with resin, a metal-clad laminate including the metal foil with resin, and a circuit board including the metal-clad laminate.

BACKGROUND

In recent years, along with an increasing amount of information to be processed, mounting techniques involving, for example, high integration of a semiconductor device to be incorporated, high density of wiring, and a multi-layer of wiring are rapidly developed in various electronic devices. An insulating material in, for example, a circuit board used in various electronic devices is required of a low dielectric constant and a low dielectric dissipation factor in order to increase signal transmission speed and reduce signal transmission loss.

As for attaining more excellent dielectric properties (low dielectric constant and low dielectric dissipation factor), it has been known that use of only a material having a high dielectric constant, such as an epoxy resin, can hardly achieve a low dielectric constant. Combining a special technique involving modified polyarylene ether (PAE) or a hollow filler is known as a solution to this problem (see, for example, Unexamined Japanese Patent Publication No. 2004-269785 or Unexamined Japanese Patent Publication No. H10-298407). In addition, also reported is a technique of blending an epoxy resin with a radical polymerization-type thermosetting resin is also reported (see, for example, Unexamined Japanese Patent Publication No. 2008-133329).

On the other hand, warpage of a substrate is drawing attention as an important property more than ever, for further requirement of reduction in size and thickness of electronic devices. At present, a material that has been developed for purpose of obtaining high rigidity and a low coefficient of thermal expansion is expected as a material for reducing the warpage of a substrate (see, for example, Unexamined Japanese Patent Publication No. 2006-137942, Unexamined Japanese Patent Publication No. 2007-138152, Unexamined Japanese Patent Publication No. 2008-007756). That is, it is proposed that higher rigidity and a lower coefficient of thermal expansion (CTE) are preferable to reduce the warpage of a substrate.

SUMMARY

A metal foil with resin according to one aspect of the present disclosure is a metal foil with resin including a metal foil and a resin layer disposed on the metal foil, the resin layer being obtained by half-curing a resin composition. The resin composition contains a first component (component (A)) that is a polymer, a second component (component (B)) that is a polyarylene ether copolymer, and a third component (component (C)) that is an epoxy resin. The first component has structures represented by formulae (1) and (2) below, with no unsaturated bond between carbon atoms. And the first component has an epoxy value ranging from 0.2 eq/kg to 0.8 eq/kg, inclusive, and a weight-average molecular weight ranging from 200000 to 1000000, inclusive. The third component has two or more epoxy groups per molecule. The second component is compatible with the first component. And the third component is incompatible with the first component.

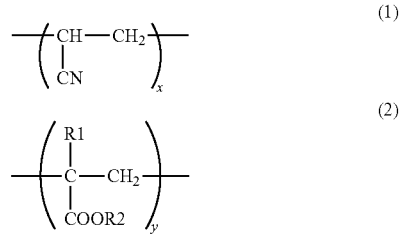

In the formulae (1) and (2), a ratio between x and y is x:y=0:1 to 0.35:0.65, R1 represents hydrogen atom (H) or methyl group (CH$_3$), and R2 represents hydrogen atom (H) or an alkyl group.

In the metal foil with resin, the second component is preferably a polyarylene ether copolymer having a weight-average molecular weight ranging from 500 to 2000, inclusive.

In the metal foil with resin, the second component is preferably a polyarylene ether copolymer having 1.5 or more and 3 or less phenolic hydroxyl groups on average at a molecular terminal per molecule.

In the metal foil with resin, the second component is preferably constituted by 2,6-dimethylphenol and at least one of the group consisting of a bifunctional phenol and a trifunctional phenol.

Further, the third component is preferred to be an oligomer-type epoxy resin having two or more epoxy groups per molecule and to be incompatible with the first component.

In the metal foil with resin, a ratio of the first component preferably ranges from 10 parts by mass to 40 parts by mass, inclusive, with respect to 100 parts by mass of a total of the first component, the second component, and the third component.

In the metal foil with resin, the resin composition may further contain a fourth component that is an inorganic filler. In this case, a ratio of the fourth component preferably ranges from 0 part by mass to 300 parts by mass, inclusive, with respect to 100 parts by mass of the total of the first component, the second component, and the third component.

A metal-clad laminate according to another aspect of the present disclosure includes a cured product of the resin layer, the resin layer being in the metal foil with resin.

A circuit board according to another aspect of the present disclosure includes a cured product of the resin layer, the resin layer being in the metal foil with resin, and a conductor pattern as a circuit on a surface of the cured product.

According to the present disclosure, there can be provided a metal foil with resin, a metal-clad laminate, and a circuit board that reduce a coefficient of thermal expansion and that have excellent dielectric properties.

DESCRIPTION OF EMBODIMENTS

Prior to describing an exemplary embodiment of the present disclosure, problems in a conventional circuit board are briefly described. Materials such as PAE and a hollow filler described in Unexamined Japanese Patent Publication No. 2004-269785 and Unexamined Japanese Patent Publication No. H10-298407 has difficulty in terms of handing and costs. Further, polyphenylene ether (PPE) described in Unexamined Japanese Patent Publication No. 2004-269785 is generally known to have a large CTE and adversely work for warpage of a substrate. A material described in Unexamined Japanese Patent Publication No. 2008-133329 that is obtained by blending an epoxy resin with a radical polymerization-type thermosetting resin has an effect of reducing the dielectric constant because the radical polymerization-type thermosetting resin exhibits a lower dielectric constant than a dielectric constant of the epoxy resin. However, the material exhibits a problem in terms of flame retardancy.

Materials, which are described in Unexamined Japanese Patent Publication No. 2006-137942, Unexamined Japanese Patent Publication No. 2007-138152, Unexamined Japanese Patent Publication No. 2008-007756, formed of a resin composition that have high rigidity and a low coefficient of thermal expansion are expected to reduce the warpage of a substrate. The materials, however, are not materials attained for purpose of reducing the warpage of a substrate, so that the materials have a problem of insufficiently giving an effect of reducing the warpage and lacking versatility. There is also a requirement of increasing heat resistance of a substrate.

The techniques disclosed in the patent literatures described above are mainly used for prepregs. A prepreg, however, generally includes, as a support, glass cloth having a high dielectric constant not to sometimes satisfy a recent requirement of further reducing the dielectric constant.

A metal foil with resin does not include glass cloth as a support, so that the metal foil with resin is considered to be effective as a method of reducing the dielectric constant of an insulating layer in, for example, a circuit board.

The present disclosure has been made in view of the points described above. Use of a metal foil with resin according to the present disclosure can reduce the warpage of a substrate and provides a metal-clad laminate and a circuit board that have more excellent dielectric properties.

Hereinafter, the exemplary embodiments according to the present disclosure will be described. The present disclosure, however, is not limited to these exemplary embodiments.

Figure 1:
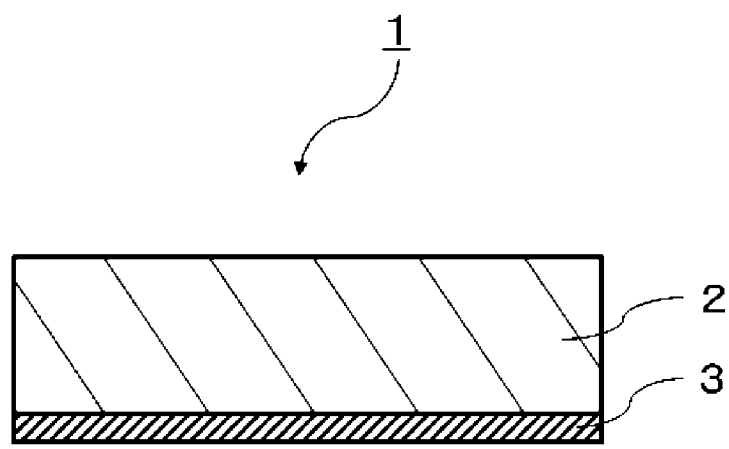
FIG. 1 is a sectional view illustrating a metal foil with resin according to an exemplary embodiment.

FIG. 1 is a sectional view illustrating a metal foil with resin according to an exemplary embodiment. Metal foil with resin 1 is characterized by including metal foil 3 and resin layer 2 disposed on metal foil 3. Resin layer 2 is obtained by half-curing a resin composition. That is, resin layer 2 is formed by applying a resin composition described later onto a matte surface of metal foil 3 and heating and drying the resin composition to a half-cured state (so-called a stage B state). It should be noted that "half-cured" in the present specification is a middle stage of a reaction of a thermosetting resin in the resin composition and refers to a state of the resin in which the resin melts and softens by hot pressing.

The resin composition is an epoxy resin containing components (A), (B), and (C) below.

In the present exemplary embodiment, when these three components of the resin composition are in a state in which curing has not proceeded, in other words, when the resin composition does not contain, for example, a curing accelerator together with the three components and contains only the resins, the component (B) is compatible with the component (A), and the component (C) is incompatible with the component (A), exhibiting phase separation from the component (A). Measurement for whether the components are compatible or incompatible with each other can be determined by, for example, a measurement method used in examples described later. On the other hand, when the resin composition is in a half-cured state and a cured state in which curing has proceeded (for example, when the resin composition contains a curing accelerator together with the three components), curing of the components (B) and (C) is promoted, whereas the component (A) is incompatible with a cured product of the components (B) and (C) to be phase-separated from the cured product. With the component (A) being phase-separated from the cured product of the components (B) and (C), a cured resin can be increased in rigidity by the cured product of the components (B) and (C) and can be reduced in elasticity by the component (A).

[Component (A): Polymer]

The polymer as the component (A) in the present exemplary embodiment is a low elastic component, specifically acrylic rubber and has structures represented by the formulae (1) and (2). That is, a main chain of the component (A) is formed of the structures represented by the formulae (1) and (2), and an epoxy group is bonded to the main chain. Since the ratio between x and y is x:y=0:1 to 0.35:0.65, there is a case in which the main chain of the component (A) is formed of only the structure represented by the formula (2). Except this case, sequence of the structures represented by the formulae (1) and (2) is not particularly limited.

The component (A) includes no unsaturated bond between carbon atoms, such as a double bond or a triple bond. That is, carbon atoms in the component (A) are bonded by a saturated bond (single bond). Possession of an unsaturated bond between carbon atoms causes embrittlement due to reducing elasticity caused by oxidation over time.

Further, the component (A) has an epoxy value ranging from 0.2 eq/kg to 0.8 eq/kg, inclusive. The component (A) having an epoxy value of less than 0.2 eq/kg has less epoxy groups that react with the component (B) and the thermosetting resin as the component (C), so that thermoplasticity of the component (A) is increased to reduce the heat resistance of the metal-clad laminate and the circuit board. In contrast, the component (A) having an epoxy value of more than 0.8 eq/kg is compatible with the components (B) and (C), so that glass-transition temperature (Tg) of laminates (metal-clad laminate 11 and circuit board 21) is decreased to deteriorate the heat resistance of the laminates.

The component (A) is a polymer having a weight-average molecular weight (Mw) ranging from 200000 to 1000000, inclusive. The component (A) having a weight-average molecular weight of less than 200000 deteriorates chemical resistance. In contrast, the component (A) having a weight-average molecular weight of more than 1000000 reduces moldability.

Addition of the component (A) described above to the resin composition is considered to make a cured product of this resin composition less likely to absorb moisture, so that moisture resistance of the laminates can be increased to improve insulation reliability.

[Component (B): Polyarylene Ether Copolymer (PAE)]

The polyarylene ether copolymer as the component (B) in the present exemplary embodiment is not particularly limited as long as the component (B) is compatible with the component (A).

Specifically, for example, a polyarylene ether copolymer having a weight-average molecular weight (Mw) ranging preferably from 500 to 2000, inclusive, more preferably from 650 to 1500, inclusive, is used. The polyarylene ether copolymer having a weight-average molecular weight (Mw) of 500 or more can give a cured product having sufficient heat resistance, and the polyarylene ether copolymer having a weight-average molecular weight (Mw) of 2000 or less is considered to be certainly compatible with the component (A) and is likely to react with the component (C) as curing proceeds. Further, melt viscosity does not become excessively high, so that sufficient fluidity can be obtained.

The weight-average molecular weight of the polyarylene ether copolymer in the present exemplary embodiment can be measured with use of, for example, gel permeation chromatography or the like.

The component (B) is preferably a polyarylene ether copolymer having 1.5 or more and 3 or less phenolic hydroxyl groups on average at a molecular terminal per molecule. Further, the component (B) more preferably has 1.8 or more and 2.4 or less phenolic hydroxyl groups on average at a molecular terminal per molecule. The component (B) having 1.5 or more and 3 or less terminal hydroxyl groups on average is considered to be capable of sufficiently obtaining reactivity with an epoxy group of the epoxy resin as the component (C) described later, giving a cured product more excellent in heat resistance, improving storage stability of the resin composition, and keeping the dielectric constant and the dielectric dissipation factor low.

In the present exemplary embodiment, a number of hydroxyl groups in the component (B) is known from specification of a polyarylene ether copolymer product to be used. The number of terminal hydroxyl groups is specifically, for example, a value or the like representing an average value of the hydroxyl groups per molecule in an entire polyarylene ether copolymer present in one mole of the component (B).

Further, the component (B) has an intrinsic viscosity ranging from 0.03 dl/g to 0.12 dl/g, inclusive, more preferably from 0.06 dl/g to 0.095 dl/g, inclusive, the intrinsic viscosity being measured in methylene chloride at 25° C. The component (B) having an intrinsic viscosity in the ranges described above is considered to be capable of improving the heat resistance of a cured product and giving sufficient fluidity to more suppress molding defects.

The intrinsic viscosity referred to herein is also known from specification of a polyarylene ether copolymer product to be used. The intrinsic viscosity referred to herein is intrinsic viscosity measured in methylene chloride at 25° C., more specifically, for example, a value or the like obtained by measuring a methylene chloride solution with a concentration of 0.18 g/45 ml (liquid temperature 25° C.) by a viscometer. Examples of the viscometer include ViscoSystem AVS 500 manufactured by SCHOTT Instruments GmbH.

Specific examples of the polyarylene ether copolymer as the component (B) include a polyarylene ether copolymer formed of 2,6-dimethylphenol and at least one of the group consisting of a bifunctional phenol and a trifunctional phenol, and one containing as a main component a polyphenylene ether such as poly(2,6-dimethyl-1,4phenylene oxide). Examples of the bifunctional phenol include tetramethyl bisphenol A.

More specific examples of the polyarylene ether copolymer as the component (B) include a polyarylene ether copolymer having a structure represented by a general formula (3) below.

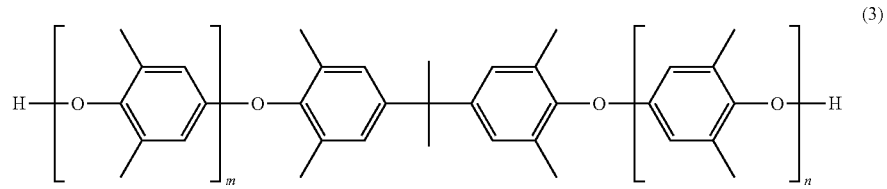

(3)

In the formula (3), m and n can be any values that give a degree of polymerization for making the intrinsic viscosity fall within the ranges described above. Specifically, a total value of m and n preferably ranges from 1 to 30, inclusive. Further, m preferably ranges from 0 to 20, inclusive, and n preferably ranges from 0 to 20, inclusive. Use of the polyarylene ether copolymer having such constitution can certainly give a resin composition that provides a cured product more excellent in the dielectric properties and in heat resistance.

The polyarylene ether copolymer can be produced by, for example, a method described in International Publication No. WO 2007/067669. A commercial product can also be used as the polyarylene ether copolymer, and, for example, "SA-90" or the like manufactured by SABIC Innovative Plastics can be used.

[Component (C): Epoxy Resin]

The epoxy resin used as the component (C) in the present exemplary embodiment is not particularly limited as long as the epoxy resin is an oligomer-type epoxy resin having two or more epoxy groups per molecule and is incompatible with the component (A).

A number of epoxy groups referred to herein is known from specification of an epoxy resin product to be used. The number of epoxy groups in the epoxy resin is specifically, for example, a value or the like representing an average value of the epoxy groups per molecule in an entire epoxy resin present in one mole of the epoxy resin.

Specific examples of the epoxy resin include a bisphenol A epoxy resin, a bisphenol F epoxy resin, a biphenyl epoxy resin, a triphenylmethane epoxy resin, a cresol novolac epoxy resin, a dicyclopentadiene epoxy resin, a naphthalene ring-containing epoxy resin, an alicyclic epoxy resin, a bromine-containing epoxy resin, and hydrogenated epoxy resins of these epoxy resins. These epoxy resins may be used alone or in combination of two or more epoxy resins.

At least one epoxy resin selected from the group consisting of a naphthalene ring-containing epoxy resin, a dicyclopentadiene epoxy resin, a cresol novolac epoxy resin, and a triphenylmethane epoxy resin is preferably used. Use of such an epoxy resin can more certainly give a high Tg and high heat resistance, make the component (C) likely to be phase-separated from the component (A), and reduce the elasticity of a cured product.

In the resin composition, a mass ratio among the components (A), (B), and (C) is not particularly limited as long as the resin composition has the properties described above. A ratio of the component (A), however, preferably ranges from 10 parts by mass to 40 parts by mass, inclusive, with respect to 100 parts by mass of the total of the component (A), the component (B), and the component (C). Blending the component (A) in such a range gives an advantage of achieving both the rigidity and low elasticity of the laminates without deteriorating the dielectric properties of the laminates.

It is possible to appropriately adjust a mixing ratio among the components when the resin composition of the present exemplary embodiment is prepared. For example, a mass ratio between a sum of the components (B) and (C) and the component (A) is desired to range from 90:10 to 60:40 in the resin composition. The component (B) is desired to have a mass ratio ranging from 40 parts by mass to 85 parts by mass, inclusive, with respect to 100 parts by mass of the total of the components (A), (B), and (C) in terms of the dielectric properties. As a mass ratio between the components (B) and (C), a ratio of an epoxy equivalent of the component (C) to a hydroxyl group equivalent of the component (B) (epoxy equivalent of component (C)/hydroxyl group equivalent of component (B)) preferably ranges from 1.0 to 4.0, inclusive, in terms of the heat resistance.

[Component (D): Inorganic Filler]

In the metal foil with resin, the resin composition may further contain an inorganic filler (component (D)).

The inorganic filler that can be used in the present exemplary embodiment is not particularly limited. Examples of the inorganic filler include spherical silica, barium sulfate, silicon oxide powder, crushed silica, fired talc, barium titanate, titanium oxide, clay, alumina, mica, boehmite, zinc borate, zinc stannate, boron nitride, and other metal oxides and metal hydrates. Addition of such an inorganic filler to the resin composition can increase dimensional stability of the laminates.

Further, silica is preferred to be used for an advantage of reducing the dielectric dissipation factor (Df) of the laminates.

When the resin composition contains the component (D), the component (D) is preferred to be contained in a range from 0 parts by mass to 250 parts by mass, inclusive, relative to 100 parts by mass of the total of the components (A), (B), and (C). The resin composition containing more than 300 parts by mass of the inorganic filler possibly gives a laminate high in elasticity and increases the warpage of a substrate due to an increase in CTE.

The resin composition of the present exemplary embodiment may also contain a component other than the components described above. For example, the resin composition may contain a curing accelerator. The curing accelerator is not particularly limited. There can be used, for example, imidazoles and derivatives of the imidazoles, an organophosphorus compound, metal soaps such as zinc octanoate, secondary amines, tertiary amines, and quaternary ammonium salts. The resin composition may also contain, for example, a photostabilizer, a viscosity modifier, and a flame retardant.

[Metal Foil with Resin]

The resin composition can be prepared by blending the components (A), (B), and (C), to which the component (D) and a curing accelerator are added as necessary. Further, a resultant mixture can be diluted with a solvent to prepare varnish of the resin composition.

Specifically, first, components of the resin composition that can be dissolved in an organic solvent are charged into and dissolved in an organic solvent, for example. In this procedure, heating may be performed as necessary. Then, a component that is used as necessary and is not dissolved in an organic solvent, for example, an inorganic filler is added and dispersed to a predetermined dispersion state with use of, for example, a ball mill, a bead mill, a planetary mixer, or a roll mill to prepare a varnish resin composition. The organic solvent used herein is not particularly limited. Specific examples of the organic solvent include ketone solvents such as acetone, methyl ethyl ketone, and cyclohexanone, aromatic solvents such as toluene and xylene, and nitrogen-containing solvents such as dimethylformamide.

Metal foil with resin 1 is obtained by, for example, a method of applying the resultant resin varnish onto a matte surface of metal foil 3 such as a copper foil so that a thickness of cured resin varnish ranges from 10 μm to 100 μm, inclusive, and then drying the resin varnish. That is, metal foil with resin 1 according to the present exemplary embodiment includes metal foil 3 and resin layer 2 formed on metal foil 3 by applying the resin varnish onto the metal foil and half-curing the resin varnish. Such metal foil with resin 1 can sufficiently suppress generation of the warpage of a substrate and produce a molded body such as circuit board 21 that has excellent heat resistance and excellent dielectric properties.

The application of the resin varnish onto metal foil 3 can be repeated a plurality of times as necessary. In this procedure, it is also possible to repeat the application with use of a plurality of types of resin varnish that are different in composition and concentration, for adjusting the composition and resin thickness to finally desired composition and thickness.

Metal foil 3 to which the resin varnish has been applied is heated under desired heating conditions of, for example, a temperature ranging from 120° C. to 190° C., inclusive, and a period ranging from 3 minutes to 15 minutes, inclusive, to give metal foil with resin 1 in a half-cured state (stage B). Resin layer 2 in metal foil with resin 1 according to the present exemplary embodiment is usually in a state of the stage B. The present disclosure, however, includes a metal foil with resin obtained by applying the resin varnish to metal foil 3 and just drying the resin varnish, that is, a metal foil with resin including resin layer 2 in a state of a stage A.

[Metal-clad Laminate and Circuit Board]

Figure 2:
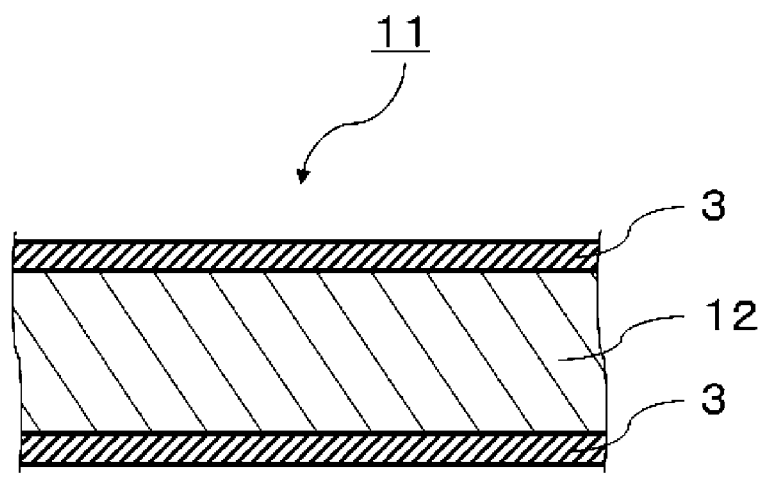
FIG. 2 is a sectional view illustrating a metal-clad laminate according to an exemplary embodiment.

FIG. 2 is a sectional view illustrating a metal-clad laminate according to an exemplary embodiment. Metal-clad laminate 11 is characterized by including a cured product of resin layer 2 in metal foil with resin 1 described above. Metal-clad laminate 11 can be obtained, for example, by stacking metal foil 3 on metal foil with resin 1 and subjecting a stacked body to heat pressure molding or by randomly stacking metal foil with resin 1, another generalized prepreg, and metal foil 3 and subjecting a stacked body to heat pressure molding, to cure resin layer 2 in metal foil with resin 1 for attachment with metal foil 3. Such metal-clad laminate 11 is considered to be capable of sufficiently suppressing generation of the warpage of a substrate and producing circuit board 21 that has excellent heat resistance and excellent dielectric properties.

As a specific method of manufacturing metal-clad laminate 11 with use of metal foil with resin 1 according to the present exemplary embodiment, there can be exemplified a method of manufacturing a metal-clad laminated body by disposing metal foil 3 on resin layer 2 in metal foil with resin 1 to form a body to be pressed and subjecting the body to heat pressure molding for lamination and integration.

More specifically, for example, first, metal foil 3 having a thickness ranging from about 12 μm to about 35 μm, inclusive, is disposed on resin layer 2 in metal foil with resin 1 to form a body to be pressed, and the body is heated and pressed for 50 minutes to 90 minutes under conditions of a temperature ranging from 170° C. to 200° C., inclusive, and a pressure ranging from 10 kg/cm2 to 30 kg/cm2, inclusive. Then, metal-clad laminate 11 to which metal foils 3 (for example, copper foils) are attached on both surfaces of metal-clad laminate 11 is obtained. Then, metal foil with resin 1 is further disposed on both upper and lower surfaces of one obtained by removing metal foils 3 from the resultant metal-clad laminate 11, in such a manner that the resin layer is directed toward metal-clad laminate 11, to form a body to be pressed. And the body is heated and pressed again to give metal-clad laminate 11 to which metal foils 3 are attached on both surfaces of metal-clad laminate 11. This heat pressure molding and removal of metal foil 3 can be repeated a plurality of times to give metal-clad laminate 11 having a thickness ranging from 30 μm to 800 μm, inclusive.

Figure 3:
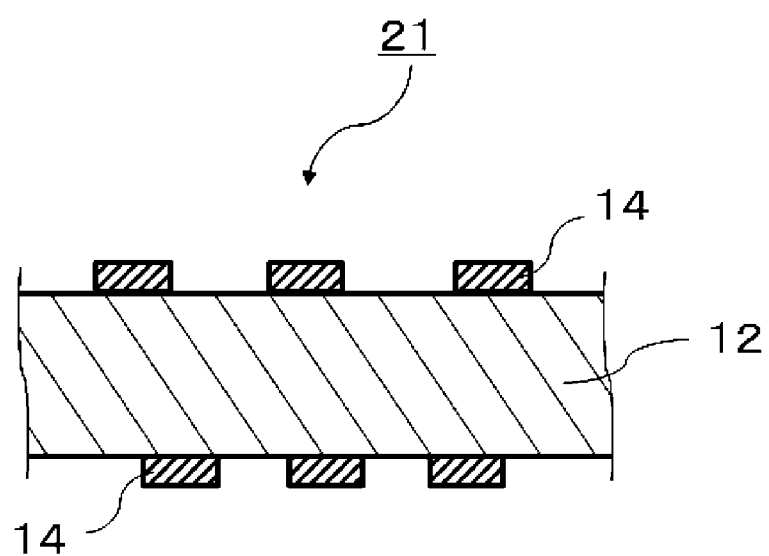
FIG. 3 is a sectional view illustrating a circuit board according to an exemplary embodiment.

FIG. 3 is a sectional view illustrating a circuit board according to an exemplary embodiment. Circuit board 21 is characterized by including the cured product of resin layer 2 in metal foil with resin 1 as described above, and conductor pattern 14 as a circuit on a surface of the cured product. Circuit board 21 according to the present exemplary embodiment can be obtained, for example, by etching metal foil 3 on a surface of the laminated body that is manufactured above and is formed of metal foil 3 and the cured product of resin layer 2 in metal foil with resin 1 and thus partially removing the metal foil to form a circuit.

The present specification discloses various aspects of techniques as described above, from among which main techniques are summarized as follows.

A metal foil with resin according one aspect of the present disclosure is a metal foil with resin including a metal foil and a resin layer disposed on the metal foil, the resin layer being obtained by half-curing a resin composition. The resin composition contains a component (A) that is a polymer, a component (B) that is a polyarylene ether copolymer (PAE), and a component (C) that is an epoxy resin. The component (A) has structures represented by formulae (1) and (2) below, with no unsaturated bond between carbon atoms. And the component (A) has an epoxy value ranging from 0.2 eq/kg to 0.8 eq/kg, inclusive, and a weight-average molecular weight ranging from 200000 to 1000000, inclusive. The component (C) has two or more epoxy groups per molecule. The component (B) is compatible with the component (A), and the component (C) is incompatible with the component (A).

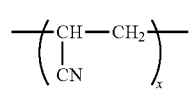

(1)

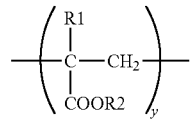

(2)

In the formulae (1) and (2), a ratio between x and y is x:y=0:1 to 0.35:0.65, R1 represents hydrogen atom (H) or methyl group (CH$_3$), and R2 represents hydrogen atom (H) or an alkyl group.

Such constitution can decrease elasticity and ease stress of a laminate and reduce warpage of a substrate and can also provide a metal foil with resin that has both excellent heat resistance and excellent dielectric properties. That is, the metal foil with resin according to the present disclosure is a useful metal foil with resin that is excellent in balance among suppression of the warpage of a substrate, heat resistance and dielectric properties.

In the metal foil with resin, the component (B) is preferably a polyarylene ether copolymer having a weight-average molecular weight ranging from 500 to 2000, inclusive. This is considered to make the component (B) compatible with the component (A), to promote curing of the component (B) with the component (C) in a half cured state and a cured state in which curing has proceeded, and to separate a cured product of the components (B) and (C) from the component (A), so that a resin cured product is obtained that has sufficient heat resistance.

In the metal foil with resin, the component (B) is preferably a polyarylene ether copolymer having 1.5 or more and 3 or less phenolic hydroxyl groups on average at a molecular terminal per molecule. This is considered to be capable of sufficiently giving reactivity between the component (B) and an epoxy group of the epoxy resin as the component (C), giving a cured product more excellent in heat resistance, improving storage stability of the resin composition, and keeping a dielectric constant and a dielectric dissipation factor low.

In the metal foil with resin, the component (B) is preferably formed of 2,6-dimethylphenol and at least one of the group consisting of a bifunctional phenol and a trifunctional phenol. This is considered to certainly give the effects described above.

Further, in the metal foil with resin, the component (C) is preferably an oligomer-type epoxy resin having two or more epoxy groups per molecule. In this case, the component (C) is considered to be likely to be phase-separated from the component (A) to reduce elasticity of a cured product.

In the metal foil with resin, the component (A) preferably ranges from 10 parts by mass to 40 parts by mass, inclusive, with respect to 100 parts by mass of a total of the components (A), (B), and (C). This is considered to be capable of making a metal-clad laminate achieve both dielectric properties and heat resistance and making a laminate exhibit low elasticity to reduce the warpage of a substrate.

In the metal foil with resin, the resin composition may further contain a component (D) that is an inorganic filler. In this case, the component (D) preferably ranges from 0 parts by mass to 300 parts by mass, inclusive, relative to 100 parts by mass of the total of the components (A), (B), and (C). This is considered to realize a lower dielectric dissipation factor.

A metal-clad laminate according to another aspect of the present disclosure is characterized by including a cured product of the resin layer, the resin layer being in the metal foil with resin. A circuit board according to another aspect of the present disclosure is characterized by including a cured product of the resin layer, the resin layer being in the metal foil with resin, and a conductor pattern as a circuit on a surface of the cured product.

Such configurations can sufficiently suppress generation of the warpage of a substrate and provide a metal-clad laminate and a circuit board that have high heat resistance and excellent dielectric properties.

Hereinafter, the present disclosure will be described more specifically by way of examples. A scope of the present disclosure, however, is not limited to these examples.

EXAMPLES

First, components will be described that were used to prepare resin compositions in the present examples.

(Component A: Polymer)

Polymer 1: acrylic rubber "SG-P3" manufactured by Nagase ChemteX Corporation (in the formula, R1 represents a hydrogen atom and R2 represents a butyl group or an ethyl group, epoxy value 0.2 eq/kg, Mw 850000)

Polymer 2: acrylic rubber "SG-P3LC improve 24" manufactured by Nagase ChemteX Corporation (in the formula, R1 represents a hydrogen atom or a methyl group and R2 represents a methyl group, a butyl group, or an ethyl group, epoxy value 0.2 eq/kg, Mw 650000)

Polymer 3: acrylic rubber "SG-P3 improve 179" manufactured by Nagase ChemteX Corporation (in the formula, R1 represents a hydrogen atom and R2 represents a butyl group or an ethyl group, epoxy value 0.7 eq/kg, Mw 850000)

Polymer 4: acrylic rubber "SG-P3 improve 225" manufactured by Nagase ChemteX Corporation (in the formula, R1 represents a hydrogen atom or a methyl group and R2 represents a methyl group or an ethyl group, epoxy value 0.2 eq/kg, Mw 650000)

Polymer 5: acrylic rubber "PMS-12-82" manufactured by Nagase ChemteX Corporation (in the formula, R1 represents a hydrogen atom or a methyl group and R2 represents a butyl group or an ethyl group, epoxy value 0.2 eq/kg, Mw 500000)

(Component B: PAE)

PAE 1: SA90 manufactured by SABIC Innovative Plastics (weight-average molecular weight 1500, 1.9 hydroxyl groups, terminal hydroxyl group concentration: 1270 μmol/g)

PAE 2: polyarylene ether copolymer (polyphenylene ether synthesized by the method described in WO 2007/067669, weight-average molecular weight 800, 1.8 hydroxyl groups, terminal hydroxyl group concentration: 2250 μmol/g)

PAE 3: SA120 manufactured by SABIC Innovative Plastics (weight-average molecular weight 2500, 1.2 hydroxyl groups, terminal hydroxyl group concentration: 400 μmol/g)

(Component (C): Epoxy Resin)

Epoxy resin 1: oligomer-type naphthalene epoxy resin ("HP9500" manufactured by DIC Corporation)

Epoxy resin 2: oligomer-type dicyclopentadiene epoxy resin ("HP7200H" manufactured by DIC Corporation)

Epoxy resin 3: oligomer-type cresol novolac epoxy resin ("N680" manufactured by DIC Corporation)

Epoxy resin 4: oligomer-type triphenylmethane epoxy resin: "EPPN-502H" manufactured by Nippon Kayaku Co., Ltd.

Epoxy resin 5: monomer-type triphenylmethane epoxy resin: "VG3101" manufactured by Printec Corporation (Component (D): Inorganic Filler)

Spherical silica 1: spherical silica SC2500-GFL (manufactured by Admatechs Company Limited) surface-treated with hexyltrimethoxysilane ("KBM3063" manufactured by Shin-Etsu Chemical Co., Ltd.)

(Curing Accelerator)

2E4MZ: 2-ethyl-4-imidazole (manufactured by SHIKOKU CHEMICALS CORPORATION)

Zinc octanoate: "Zn-OCTOATE" manufactured by DIC Corporation

Example 1

(Metal Foil with Resin)

First, a polyarylene ether (PAE) copolymer was mixed with toluene, and a resultant mixed liquid was heated to 80° C. for dissolution of the polyarylene ether copolymer in toluene to give a 50% by mass solution of the polyarylene ether copolymer in toluene. Then, an epoxy resin and a polymer were added to the solution of the polyarylene ether copolymer in toluene so as to give a blending ratio described in Table 1, followed by stirring for 30 minutes for complete dissolution. Subsequently, a curing accelerator and an inorganic filler were further added and dispersed with a ball mill to give a varnish resin composition (resin varnish). A metal foil with resin was manufactured with use of the resultant varnish and used for evaluation performed later.

For the metal foil with resin, 12-μm-copper foil (3EC III manufactured by MITSUI MINING & SMELTING CO., LTD.) was used as a copper foil. Subsequently, the resin varnish was applied onto copper foils so that cured resin varnish gave thicknesses of 30 μm and 100 μm, and the copper foils with the resin varnish were heated and dried at 130° C. for 6 minutes until the resin varnish became a half-cured state, to give metal foils with resin.

(Metal-clad laminate)

Sample for evaluation of glass-transition temperature (Tg), coefficient of thermal expansion (CTE), heat resistance, elastic modulus, and appearance of CCL (copper-clad laminate) having copper foil etched A 12-μm-thick copper foil (3EC III manufactured by MITSUI MINING & SMELTING CO., LTD.) was disposed on a resin surface of the metal foil with resin that had been manufactured above and had a resin layer thickness of 30 μm, to form a body to be pressed, and the body was heated and pressed for 90 minutes under conditions of a temperature of 200° C. and a pressure of 30 kg/cm2 to give a 30-μm-thick copper-clad laminate to which the copper foils were attached on both surfaces of the copper-clad laminate.

Sample for evaluation of dielectric properties (dielectric constant and dielectric dissipation factor)

A 12-μm-thick copper foil (3EC III manufactured by MITSUI MINING & SMELTING CO., LTD.) was disposed on a resin surface of the metal foil with resin that had been manufactured above and had a resin layer thickness of 100 μm, to form a body to be pressed, and the body was heated and pressed for 90 minutes under conditions of a temperature of 200° C. and a pressure of 30 kg/cm2 to give a copper-clad laminate to which the copper foils were attached on both surfaces of the copper-clad laminate. In addition, a metal foil with resin was further disposed on both upper and lower surfaces of one obtained by removing the copper foils from the copper-clad laminate, in such a manner that a resin surface of the metal foil with resin was directed inside, to form a body to be pressed, and the body was heated and pressed for 90 minutes under conditions of a temperature of 200° C. and a pressure of 30 kg/cm2 to give a copper-clad laminate to which the copper foils were attached on both surfaces of the copper-clad laminate. This heat pressure molding and removal of copper foils were repeated four times to give a 900-µm-thick copper-clad laminate. [Examples 2 to 11 and Comparative Examples 1 to 3]

Metal foils with resin and copper-clad laminates were obtained in the same manner as in Example 1 except that blending for the resin composition was changed as indicated in Table 1.

The metal foils with resin and copper-clad laminates obtained as described above were used as samples for evaluation and subjected to evaluation tests according to methods described below.

[Evaluations]
(Compatibility)

As for compatibility, a film produced by solution casting with use of a 50:50 mixed solution of two types of components was prepared. By visually observing the film, compatibility of the film was determined as "OK" if the film was transparent, and compatibility of the film was determined as "NG" if the film was opaque. Specifically, the following films were used for evaluation.

Compatibility A/B:

A 20% solution of a component (A) in methyl ethyl ketone (MEK) and a 20% solution of a component (B) in toluene were prepared, and, by mixing these solutions, a mixed solution having a solid content ratio between the components (A) and (B) of 50:50 was prepared. The mixed solution was cast onto a glass plate and then dried at a temperature of 130° C. for 5 minutes to vaporize the solvents so that a film was produced.

Compatibility A/C:

A 20% solution of a component (A) in methyl ethyl ketone (MEK) and a 20% solution of a component (C) in MEK that were prepared, and, by mixing these solutions, a mixed solution having a solid content ratio between the components (A) and (C) of 50:50 was prepared. The mixed solution was cast onto a glass plate and then dried at a temperature of 130° C. for 5 minutes to vaporize the solvents so that a film was produced.

(Glass-transition temperature (Tg))

Using a sample that was obtained by removing the copper foils from the copper-clad laminate, the glass-transition temperature was measured by differential scanning calorimetry (DSC) according to IPC-TM-650-2.4.25 under a condition of a temperature rise rate of 20° C./min.

(Coefficient of thermal expansion (CTE))

Using a sample that was obtained by removing the copper foils from the copper-clad laminate, the coefficient of thermal expansion in a surface direction at a temperature of lower than the glass-transition temperature of cured product of the resin was measured by thermo-mechanical analysis (TMA) according to JIS C 6481. The measurement was performed with use of a TMA device ("TMA6000" manufactured by SII NanoTechnology Inc.).

(Heat Resistance)

In compliance with a standard of JIS C 6481, the copper-clad laminate that was cut out in a predetermined size was left to stand still in a thermostatic chamber set at 270° C., 280° C., and 290° C. for 1 hour and then extracted. Subsequently, an evaluation was performed by visually observing sample pieces, heat resistance of the sample was determined as "VG" if no blister was generated in the sample treated at 290° C., heat resistance of the sample was determined as "OK" if no blister was generated in the sample treated at 280° C., heat resistance of the sample was determined as "NB" if no blister was generated in the sample treated at 270° C., and heat resistance of the sample was determined as "NG" if a blister was generated in the sample treated at 270° C.

(Elastic modulus)

Using a sample that was obtained by removing the copper foils from the copper-clad laminate, the elastic modulus (25° C.) was measured by dynamic mechanical analysis (DMA). The measurement was performed by a dynamic viscoelasticity measuring device ("DMS6100" manufactured by SII NanoTechnology Inc.) with use of a tensile module, under a temperature rise condition of 5° C./min.

(Amount of warpage)

First, a copper-clad laminate of R-A555 manufactured by Panasonic Corporation (thickness of insulating layer: 60 im, copper foil: 12 im (3EC III manufactured by MITSUI MINING & SMELTING CO., LTD.)) was prepared. Four pieces of the above-produced metal foils with resin were stacked together on each of upper surface and lower surface of the copper-clad laminate in such a manner that each resin surface of the metal foils with resin was directed toward the copper-clad laminate. A stacked body was heated and pressed for 90 minutes under conditions of a temperature of 200° C. and a pressure of 30 kg/cm2 so that a pseudo 10-layered laminate including a copper foil on an entire surface of each of the layers was obtained. This 10-layered laminate was used as a substrate for evaluation of warpage.

Next, the above-obtained substrate was measured for warpage with use of a warpage measurement apparatus ("THERMOIRE PS200" manufactured by Akrometrix, LLC) according to a shadow moire measurement technique. The substrate was heated from 25° C. to 260° C. and then cooled to 25° C. After that, an amount of warpage in the substrate was acquired as a difference between a maximum value and a minimum value of the amount of warpage in the substrate.

(Dielectric Properties (Dielectric Constant and Dielectric Dissipation Factor))

The dielectric constant and the dielectric dissipation factor of a substrate for evaluation were measured at 1 GHz according to IPC-TM650-2.5.5.9. Specifically, the dielectric constant and the dielectric dissipation factor of the substrate for evaluation were measured at 1 GHz with use of an impedance analyzer (HP4291B manufactured by Agilent Technologies).

(Appearance of CCL having copper foils etched)

A laminate obtained by removing the copper foils from the copper-clad laminate through etching was visually observed and evaluated by confirming a void and a blur.
OK: no void, no blur was visually observed.
NG: void, blur, or bleeding of resin was observed on surface of 300 mm ×300 mm laminate.

Table 1 below shows results of the evaluations. The values of the components in the table are based on parts by mass.

TABLE 1

|   |   | Molecular weight Mw | Epoxy value eq/kg | Molecular weight Mw | Number of terminal hydroxyl groups | Example 1 | Example 2 | Example 3 | Example 4 |
|---|---|---|---|---|---|---|---|---|---|
| A | Polymer 1 | 850000 | 0.2 |   |   | 20 |   |   |   |
|   | Polymer 2 | 650000 | 0.2 |   |   |   | 20 |   |   |
|   | Polymer 3 | 850000 | 0.7 |   |   |   |   | 20 |   |
|   | Polymer 4 | 650000 | 0.2 |   |   |   |   |   | 20 |
|   | Polymer 5 | 500000 | 0.2 |   |   |   |   |   |   |
| B | PAE 1 |   |   | 1500 | 1.9 | 60 | 60 | 60 | 60 |
|   | PAE 2 |   |   | 800 | 1.8 |   |   |   |   |
|   | PAE 3 |   |   | 2500 | 1.2 |   |   |   |   |
| C | Epoxy resin 1 (oligomer-type) |   |   |   |   | 20 | 20 | 20 | 20 |
|   | Epoxy resin 2 (oligomer-type) |   |   |   |   |   |   |   |   |
|   | Epoxy resin 3 (oligomer-type) |   |   |   |   |   |   |   |   |
|   | Epoxy resin 4 (oligomer-type) |   |   |   |   |   |   |   |   |
|   | Epoxy resin 5 (monomer-type) |   |   |   |   |   |   |   |   |
| Curing accelerator | 2E4MZ |   |   |   |   | 0.2 | 0.2 | 0.2 | 0.2 |
|   | Zinc octanoate |   |   |   |   | 1 | 1 | 1 | 1 |
| D | Spherical silica 1 |   |   |   |   |   |   |   |   |
|   | Total |   |   |   |   | 101.2 | 101.2 | 101.2 | 101.2 |
| — | Compatibility A/B |   |   |   |   | OK | OK | OK | OK |
|   | Compatibility A/C |   |   |   |   | NG | NG | NG | NG |
|   | Tg (° C.) |   |   |   |   | 161 | 160 | 157 | 161 |
|   | CTE (ppm/° C.) |   |   |   |   | 58 | 58 | 63 | 58 |
|   | (Heat resistance) |   |   |   |   | VG | OK | OK | OK |
|   | Elastic modulus (Gpa) |   |   |   |   | 3.0 | 3.2 | 3.7 | 3.2 |
|   | Amount of warpage in substrate (μm) |   |   |   |   | 443 | 461 | 505 | 472 |
|   | Dielectric constant Dx@1 GHz |   |   |   |   | 2.7 | 2.7 | 2.8 | 2.7 |
|   | Dielectric dissipation factor Df@1 GHz |   |   |   |   | 0.012 | 0.012 | 0.013 | 0.012 |
|   | (Appearance of CCL having copper foils etched) |   |   |   |   | OK | OK | OK | OK |

|   |   | Molecular weight Mw | Epoxy value eq/kg | Molecular weight Mw | Number of terminal hydroxyl groups | Example 5 | Example 6 | Example 7 | Example 8 |
|---|---|---|---|---|---|---|---|---|---|
| A | Polymer 1 | 850000 | 0.2 |   |   |   | 20 | 20 | 20 |
|   | Polymer 2 | 650000 | 0.2 |   |   |   |   |   |   |
|   | Polymer 3 | 850000 | 0.7 |   |   |   |   |   |   |
|   | Polymer 4 | 650000 | 0.2 |   |   |   |   |   |   |
|   | Polymer 5 | 500000 | 0.2 |   |   | 20 |   |   |   |
| B | PAE 1 |   |   | 1500 | 1.9 | 60 | 60 | 60 | 50 |
|   | PAE 2 |   |   | 800 | 1.8 |   |   |   |   |
|   | PAE 3 |   |   | 2500 | 1.2 |   |   |   |   |
| C | Epoxy resin 1 (oligomer-type) |   |   |   |   | 20 |   |   |   |
|   | Epoxy resin 2 (oligomer-type) |   |   |   |   |   | 20 |   |   |
|   | Epoxy resin 3 (oligomer-type) |   |   |   |   |   |   | 20 |   |
|   | Epoxy resin 4 (oligomer-type) |   |   |   |   |   |   |   | 20 |
|   | Epoxy resin 5 (monomer-type) |   |   |   |   |   |   |   |   |

TABLE 1-continued

| | | | | | | | | | | |
|---|---|---|---|---|---|---|---|---|---|---|
| Curing accelerator D | 2E4MZ Zinc octanoate Spherical silica 1 | | | | | | 0.2 1 | 0.2 1 | 0.2 1 | 0.2 1 |
| — | Total | | | | | | 101.2 | 101.2 | 101.2 | 101.2 |
| | Compatibility A/B | | | | | | OK | OK | OK | OK |
| | Compatibility A/C | | | | | | NG | NG | NG | NG |
| | Tg (° C.) | | | | | | 160 | 160 | 160 | 161 |
| | CTE (ppm/° C.) | | | | | | 60 | 62 | 62 | 62 |
| | (Heat resistance) | | | | | | OK | VG | VG | OK |
| | Elastic modulus (Gpa) | | | | | | 3.3 | 3.1 | 3.1 | 3.1 |
| | Amount of warpage in substrate (μm) | | | | | | 473 | 484 | 486 | 488 |
| | Dielectric constant Dx@1 GHz | | | | | | 2.6 | 2.7 | 2.7 | 2.7 |
| | Dielectric dissipation factor Df@1 GHz | | | | | | 0.012 | 0.012 | 0.012 | 0.012 |
| | (Appearance of CCL having copper foils etched) | | | | | | OK | OK | OK | OK |

| | | Molecular weight Mw | Epoxy value eq/kg | Molecular weight Mw | Number of terminal hydroxyl groups | Example 9 | Example 10 | Example 11 | Example 12 | Example 13 |
|---|---|---|---|---|---|---|---|---|---|---|
| A | Polymer 1 | 850000 | 0.2 | | | 20 | 40 | 60 | 20 | 20 |
| | Polymer 2 | 650000 | 0.2 | | | | | | | |
| | Polymer 3 | 850000 | 0.7 | | | | | | | |
| | Polymer 4 | 650000 | 0.2 | | | | | | | |
| | Polymer 5 | 500000 | 0.2 | | | | | | | |
| B | PAE 1 | | | 1500 | 1.9 | | 45 | 30 | 60 | 60 |
| | PAE 2 | | | 800 | 1.8 | 60 | | | | |
| | PAE 3 | | | 2500 | 1.2 | | | | | |
| C | Epoxy resin 1 (oligomer-type) | | | | | 20 | 15 | 10 | 20 | 20 |
| | Epoxy resin 2 (oligomer-type) | | | | | | | | | |
| | Epoxy resin 3 (oligomer-type) | | | | | | | | | |
| | Epoxy resin 4 (oligomer-type) | | | | | | | | | |
| | Epoxy resin 5 (monomer-type) | | | | | | | | | |
| Curing accelerator D | 2E4MZ | | | | | 0.2 | 0.15 | 0.1 | 0.2 | 0.2 |
| | Zinc octanoate | | | | | 1 | 0.75 | 0.5 | 1 | 1 |
| | Spherical silica 1 | | | | | | | | 100 | 500 |
| — | Total | | | | | 101.2 | 100.9 | 100.6 | 201.2 | 301.2 |
| | Compatibility A/B | | | | | OK | OK | OK | OK | OK |
| | Compatibility A/C | | | | | NG | NG | NG | NG | NG |
| | Tg (° C.) | | | | | 160 | 150 | 145 | 154 | 150 |
| | CTE (ppm/° C.) | | | | | 56 | 51 | 46 | 55 | 49 |
| | (Heat resistance) | | | | | VG | OK | NB | VG | VG |
| | Elastic modulus (Gpa) | | | | | 2.8 | 2.0 | 1.5 | 4.0 | 4.5 |
| | Amount of warpage in substrate (μm) | | | | | 465 | 430 | 392 | 429 | 425 |
| | Dielectric constant Dx@1 GHz | | | | | 2.8 | 2.8 | 2.9 | 3.0 | 3.1 |
| | Dielectric dissipation factor Df@1 GHz | | | | | 0.013 | 0.015 | 0.017 | 0.010 | 0.085 |
| | (Appearance of CCL having copper foils etched) | | | | | OK | OK | OK | OK | OK |

TABLE 1-continued

| | | Molecular weight Mw | Epoxy value eq/kg | Molecular weight Mw | Number of terminal hydroxyl groups | Comparative Example 1 | Comparative Example 2 | Comparative Example 3 |
|---|---|---|---|---|---|---|---|---|
| A | Polymer 1 | 850000 | 0.2 | | | 0 | 20 | 20 |
| | Polymer 2 | 650000 | 0.2 | | | | | |
| | Polymer 3 | 850000 | 0.7 | | | | | |
| | Polymer 4 | 650000 | 0.2 | | | | | |
| | Polymer 5 | 500000 | 0.2 | | | | | |
| B | PAE 1 | | | 1500 | 1.9 | 75 | 0 | 60 |
| | PAE 2 | | | 800 | 1.8 | | | |
| | PAE 3 | | | 2500 | 1.2 | | 60 | |
| C | Epoxy resin 1 (oligomer-type) | | | | | 25 | 20 | |
| | Epoxy resin 2 (oligomer-type) | | | | | | | |
| | Epoxy resin 3 (oligomer-type) | | | | | | | |
| | Epoxy resin 4 (oligomer-type) | | | | | | | |
| | Epoxy resin 5 (monomer-type) | | | | | | | 20 |
| Curing accelerator | 2E4MZ | | | | | 0.25 | 0.2 | 0.2 |
| | Zinc octanoate | | | | | 1.25 | 1 | 1 |
| D | Spherical silica 1 | | | | | | | |
| | Total | | | | | 101.5 | 101.2 | 101.2 |
| — | Compatibility A/B | | | | | — | NG | OK |
| | Compatibility A/C | | | | | NG | NG | OK |
| | Tg (° C.) | | | | | 165 | 140 | 135 |
| | CTE (ppm/° C.) | | | | | 73 | 65 | 64 |
| | (Heat resistance) | | | | | VG | NG | NG |
| | Elastic modulus (Gpa) | | | | | 4.0 | 3.5 | 3.9 |
| | Amount of warpage in substrate (μm) | | | | | 623 | 620 | 570 |
| | Dielectric constant Dx@1 GHz | | | | | 2.6 | 2.7 | 2.7 |
| | Dielectric dissipation factor Df@1 GHz | | | | | 0.010 | 0.012 | 0.012 |
| | (Appearance of CCL having copper foils etched) | | | | | OK | NG | OK |

The results demonstrated that use of the metal foil with resin according to the present disclosure can sufficiently suppress generation of the warpage and give a metal-clad laminate having excellent heat resistance and excellent dielectric properties.

In contrast, in a case of using the metal foil with resin in Comparative Example 1 that did not contain the component (A), the elastic modulus and the CTE were increased so that the warpage was increased. In addition, in a case of using the metal foil with resin in Comparative Example 2 where the component (A) was incompatible with the component (B), the appearance was deteriorated and the heat resistance was inferior. Further, in a case of using the metal foil with resin in Comparative Example 3 where the component (A) was compatible with the component (C), phase separation was less likely to occur after curing, the Tg was decreased, and the elastic modulus of the laminate was increased that the warpage of the substrate was deteriorated.

The sample in Example 1 where the polymer had a large molecular weight among Examples 1 to 4 exhibited a result of giving less warpage of the substrate due to low elasticity and a low CTE of the laminate and having high heat resistance, while maintaining superior dielectric properties. Example 10 gave a result of being slightly inferior in the dielectric properties but yet giving less warpage of the substrate due to lower elasticity and a lower CTE of the laminate and having high resistance. Examples 12 and 13 where the inorganic filler was added as the component (D) exhibited high heat resistance and excellent dielectric properties.

A metal foil with resin, and a metal-clad laminate and a circuit board that include the metal foil with resin according to the present disclosure are useful in, for example, a circuit board used for various high integration and high density electronic devices.

The invention claimed is:

1. A metal foil with resin comprising a metal foil and a resin layer disposed on the metal foil, resin layer being obtained by half-curing a resin composition, wherein:
   the resin composition contains a first component that is a polymer, a second component that is a polyarylene ether copolymer, and a third component that is an epoxy resin, the first component has structures represented by formulae (1) and (2) below, with no unsaturated bond between carbon atoms, the first component having an epoxy value ranging from 0.2 eq/kg to 0.8 eq/kg, inclusive, and a weight-average molecular weight ranging from 200000 to 1000000, inclusive, the third component has two or more epoxy groups per molecule, the second component is compatible with the first component, and the third component is incompatible with the first component,

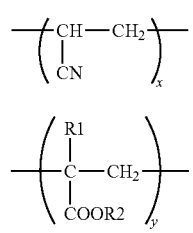

in the formulae (1) and (2), a ratio between x and y is x:y =0:1 to 0.35:0.65, R1 represents hydrogen atom or methyl group, and R2 represents hydrogen atom or an alkyl group.

2. The metal foil with resin according to claim 1, wherein the second component is a polyarylene ether copolymer having a weight-average molecular weight ranging from 500 to 2000, inclusive.

3. The metal foil with resin according to claim 1, wherein the second component is a polyarylene ether copolymer having 1.5 or more and 3 or less phenolic hydroxyl groups on average at a molecular terminal per molecule.

4. The metal foil with resin according to claim 1, wherein the second component is constituted by 2,6-dimethylphenol and at least one of the group consisting of a bifunctional phenol and a trifunctional phenol.

5. The metal foil with resin according to claim 1, wherein the third component is an oligomer-type epoxy resin having two or more epoxy groups per molecule and is incompatible with the first component.

6. The metal foil with resin according to claim 1, wherein a ratio of the first component ranges from 10 parts by mass to 40 parts by mass, inclusive, with respect to 100 parts by mass of a total of the first component, the second component, and the third component.

7. The metal foil with resin according to claim 1, wherein the resin composition further contains a fourth component that is an inorganic filler.

8. The metal foil with resin according to claim 7, wherein a ratio of the fourth component ranges from 0 part by mass to 300 parts by mass, inclusive, relative to 100 parts by mass of the total of the components (A), (B), and (C).

9. A metal-clad laminate comprising a cured product of the resin layer, the resin layer being in the metal foil with resin according to claim 1.

10. A circuit board comprising:
a cured product of the resin layer, the resin layer being in the metal foil with resin according to claim 1; and
a conductor pattern as a circuit on a surface of the cured product.

* * * * *